United States Patent [19]
Filipiak et al.

[11] Patent Number: 5,447,887
[45] Date of Patent: Sep. 5, 1995

[54] METHOD FOR CAPPING COPPER IN SEMICONDUCTOR DEVICES

[75] Inventors: Stanley M. Filipiak, Pflugerville; Avgerinos Gelatos, Austin, both of Tex.

[73] Assignee: Motorola, Inc., Schaumburg, Ill.

[21] Appl. No.: 222,759

[22] Filed: Apr. 1, 1994

[51] Int. Cl.$^6$ ...................... H01L 21/44; H01L 21/48
[52] U.S. Cl. .................................... 437/200; 437/196; 437/198
[58] Field of Search ............... 437/200, 196, 198, 200, 437/196, 198

[56] References Cited

U.S. PATENT DOCUMENTS 4,910,169  3/1990  Hoshino ............................. 437/198

FOREIGN PATENT DOCUMENTS 4192527  7/1992  Japan .

OTHER PUBLICATIONS

Hymes, S., et al. "Passivation of Copper by Silicide de Formation in dilute Silane" J. Appl. Phys. 71(9) pp. 4623–4625 (1 May 1992), (abstract).
B. Rogers, et al. "Issues in a Submicron Cu Interconnect System" 1991 Proc. 8th International IEEE VLSI multilevel Interconnect Conf. (Jun. 11–12, 1991).
Chin-An Chang et al., "Reaction between Cu and TiSi2 across different barrier layers", Appl. Phys. Lett. vol. 57, No. 6, Aug. 6, 1990 American Institute of Physic, pp. 617–619.
A. Cros et al., "Formation, oxidation, electronic and electrical properties of copper silicides", J. Appl. Phys., vol. 67, No. 7, Apr. 1, 1990, pp. 3328–3336.
B. Luther et al., "Planar Copper-Polyimide Back End Of The Line Interconnections For ULSI Devices", Jun. 8–9, 1993 VLSI Multilevel Interconnect Conference, pp. 15–20.
James S. H. Cho et al., "Reliability of CVD Cu Buried Interconnections", 1993 IEEE/IEDM, pp. 265–267.
Yasuo Takahashi et al., "New platinum sillicide formation method using reaction between platinum and silane", J. Appl. Phys. vol. 58, No. 8, Oct. 15, 1985, 1985 American Institute of Physics, pp. 3190–3194.

*Primary Examiner*—Olik Chaudhuri
*Assistant Examiner*—C. Everhart
*Attorney, Agent, or Firm*—Patricia S. Goddard

[57] ABSTRACT

A silicon nitride layer (34) has improved adhesion to underlying copper interconnect members (30) through the incorporation of an intervening copper silicide layer (32). Layer (32) is formed in-situ with a plasma enhanced chemical vapor deposition (PECVD) process for depositing silicon nitride layer (34). To form layer (32), a semiconductor substrate (12) is provided having a desired copper pattern formed thereon. The copper pattern may include copper interconnects, copper plugs, or other copper members. The substrate is placed into a PECVD reaction chamber. Silane is introduced into the reaction chamber in the absence of a plasma to form a copper silicide layer on any exposed copper surfaces. After a silicide layer of a sufficient thickness (for example, 10 to 100 angstroms) is formed, PECVD silicon nitride is deposited. The copper silicide layer improves adhesion, such that silicon nitride layer is less prone to peeling away from underlying copper members.

21 Claims, 3 Drawing Sheets

METHOD FOR CAPPING COPPER IN SEMICONDUCTOR DEVICES

FIELD OF THE INVENTION

The present invention relates generally to the use of copper in semiconductor devices, and more specifically to methods for capping copper when used in semiconductor devices.

BACKGROUND OF THE INVENTION

Aluminum and aluminum alloys are traditional metal interconnect metallurgies. While aluminum-based metallurgies have been the material of choice for use as metal interconnects over past years, concern exists as to whether aluminum will meet the demands required as circuit density and speeds for semiconductor devices increase. Because of these concerns, other materials have been researched for use as interconnects in integrated circuits, copper in particular. Advantages of the use of copper as interconnects include a lower susceptibility to electromigration failure as compared to aluminum and a lower resistivity.

A problem with the use of copper as an interconnect metallurgy is that copper readily diffuses into surrounding dielectric materials, especially silicon dioxide. To inhibit this diffusion, copper interconnects are often capped. One method of capping includes the use of a conductive barrier layer along the sidewalls and bottom surface of a copper interconnect. This conductive barrier is typically tantalum or titanium. To cap the upper surface of an interconnect, a dielectric layer, such as silicon nitride is typically used. Due to the need for low temperature processing after the copper is deposited, the silicon nitride layer cannot be deposited at temperatures in excess of 450° C. Accordingly, silicon-nitride deposition is typically performed using plasma enhanced chemical vapor deposition (PECVD) where temperatures generally range from 200° to 425° C. PECVD silicon-nitride has been used in other applications in semiconductor devices. However, in using a silicon nitride cap for copper interconnects, conventional PECVD silicon nitride creates reliability problems. In particular, silicon nitride films deposited using conventional PECVD processes have poor adhesion to copper surfaces. As an example, some nitride films can be peeled from the copper surfaces simply by scratching the film or by removing the film using an adhesive tape. These results are indicative of how the silicon nitride film might adhere to the copper in an actual fabrication process. After being deposited onto the copper surface, additional insulating layers will be deposited over the silicon nitride film. However, subsequent deposition of insulating layers onto the nitride film will produce stresses which can cause the silicon nitride layer to peel from the copper surface. Despite the fact that other layers have been deposited onto the semiconductor device, the fact that the silicon nitride film has peeled from the copper surface, creates a path for copper to diffuse outward and from moisture or other contaminates to diffuse inward.

SUMMARY OF THE INVENTION

In one form of the invention, a semiconductor device is fabricated to include a copper member having an exposed surface. A copper silicide layer is formed on the exposed copper surface. A layer comprising silicon nitride is deposited on the copper silicide layer.

DETAILED DESCRIPTION OF A PREFERRED EMBODIMENT

In accordance with the present invention, the adhesion of silicon nitride to a copper surface is improved by the addition of an intervening copper silicide layer. The copper silicide layer is created in-situ with a PECVD silicon nitride process; therefore, no additional fabrication steps are necessary in practicing the present invention as compared to prior art silicon nitride capping processes. More specifically, the copper silicide layer is formed within a PECVD reaction chamber by introducing silane ($SiH_4$) in the absence of a plasma into the chamber. The silane reacts with exposed copper surfaces to form copper silicide. After a sufficient thickness of copper silicide is formed, a plasma is generated and gases are introduced into the reaction chamber for deposition of silicon nitride onto the device, including onto the copper silicide layer. The intervening copper silicide layer acts as an adhesion layer between the silicon nitride and the copper. Tests show that a silicide layer approximately 100 angstroms (100 Å) thick is sufficient to significantly increase the adhesion between the nitride and copper.

Figure 1:
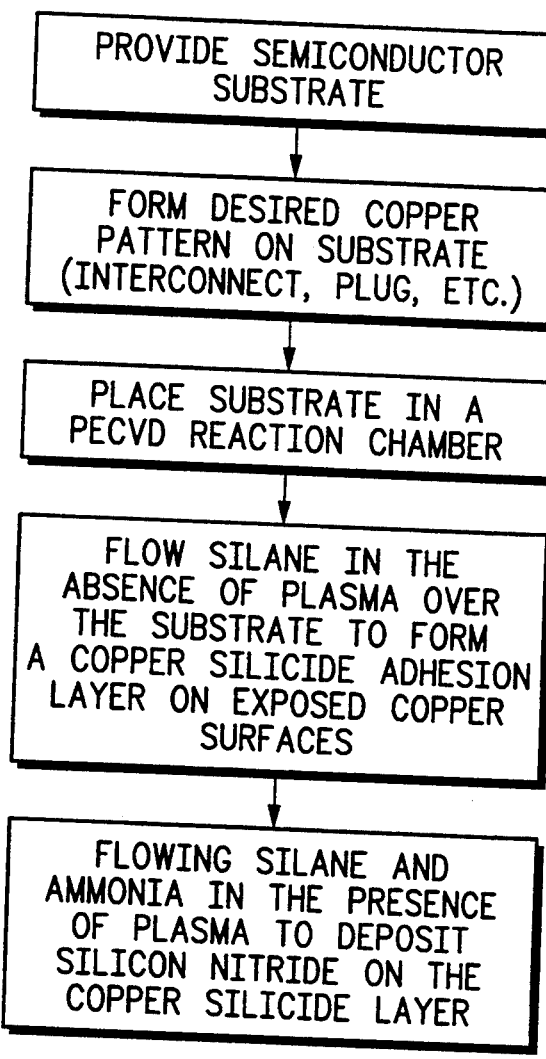
FIG. 1 is a flow chart demonstrating a process for capping copper in a semiconductor device in accordance with one embodiment of the present invention.

The present invention will be more clearly understood from the following detailed description taken in conjunction with the accompanying drawings. It is important to point out that the illustrations may not necessarily be drawn to scale and that there may be other embodiments of the present invention which are not specifically illustrated. FIG. 1 illustrates a process flow for forming a copper silicide layer in accordance with one embodiment of the present invention. This process will be explained in conjunction with the description of the cross sectional views illustrated in FIGS. 2–5.

Figure 2:
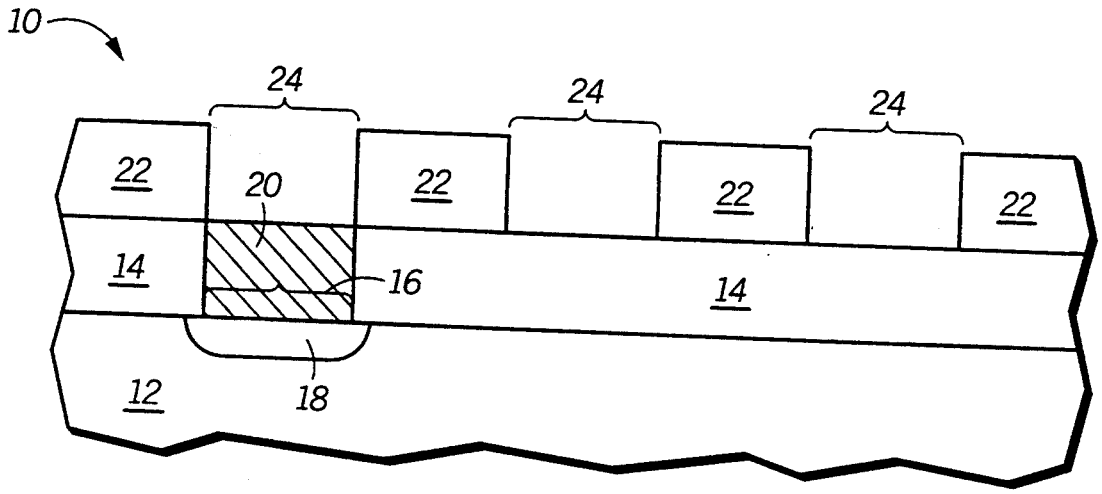
FIGS. 2–5 are cross sectional views of a portion of a semiconductor device as the device is fabricated in accordance with the process of FIG. 1.

Illustrated in a cross-sectional view in FIG. 2 is a portion of a semiconductor device 10. Device 10 includes a semiconductor substrate 12. Substrate 12 will typically be a semiconducting material, such as silicon, gallium-arsenide, or the like. Overlying semiconductor substrate 12 is a dielectric layer 14. Dielectric 14 may be one of any commonly used dielectric materials in semiconductor processing. For example, dielectric layer 14 may be silicon dioxide ($SiO_2$), phospho-silicate-glass (PSG), boron doped PSG (BPSG), tetra-ethyl-orthosilicate (TEOS), and the like. Formed within dielectric layer 14 is an opening 16, which may be formed using conventional lithographic methods. Opening 16 is created to expose a doped region 18 formed in substrate 12. Doped region 18 may be formed by conventional diffusion or ion implantation processes. A conductive plug 20 is formed within opening 16 to make contact to doped region 18. Conductive plug 20 may be made using any conventional plug methods, such as conventional tungsten plug methods. For purposes of this invention, the particular processes used to form dielectric layer 14, opening 16, doped region 18, and conductive plug 20 are not important. Furthermore, the structure of device 10 as thus far described is not a necessary element of practicing the present invention, but is described merely to demonstrate one application of using copper interconnects in a semiconductor device in accordance with the present invention.

Overlying substrate 12 is a second dielectric layer 22. Dielectric layer 22 includes a plurality of openings 24 formed therein. One of the openings exposes conductive plug 20, as illustrated in FIG. 2. Each of openings 24 will define where a copper interconnect in accordance with the present invention will be formed. The purpose of having one of openings 24 expose conductive plug 20 is to allow a subsequently formed interconnect to be electrically coupled to the underlying doped region 18. In accordance with other embodiments of the present invention, opening within dielectric layer 22 may expose other underlying conductive members. For example, the openings may be used to expose underlying polysilicon layers, underlying metal layers, or other conductive regions to which electrical contact is desired. As with dielectric layer 14, dielectric layer 22 may be of any dielectric material used in semiconductor fabrication, including, but not limited to, silicon dioxide, PSG, BPSG, TEOS, and/or a polyimide. Openings 24 are formed within dielectric layer 22 also using conventional lithographic and etching methods. The location of openings 24 will be determined by underlying conductive members to which electrical contact is desired. Although the formation of openings 24 within dielectric layer 22 are illustrated such that there is essentially perfect selectivity between dielectric layers 22 and 14 in forming openings 24, this is not a requirement of the present invention. Furthermore, for purposes of forming interconnects in accordance with the present invention, two dielectric layers are not required.

Figure 3:
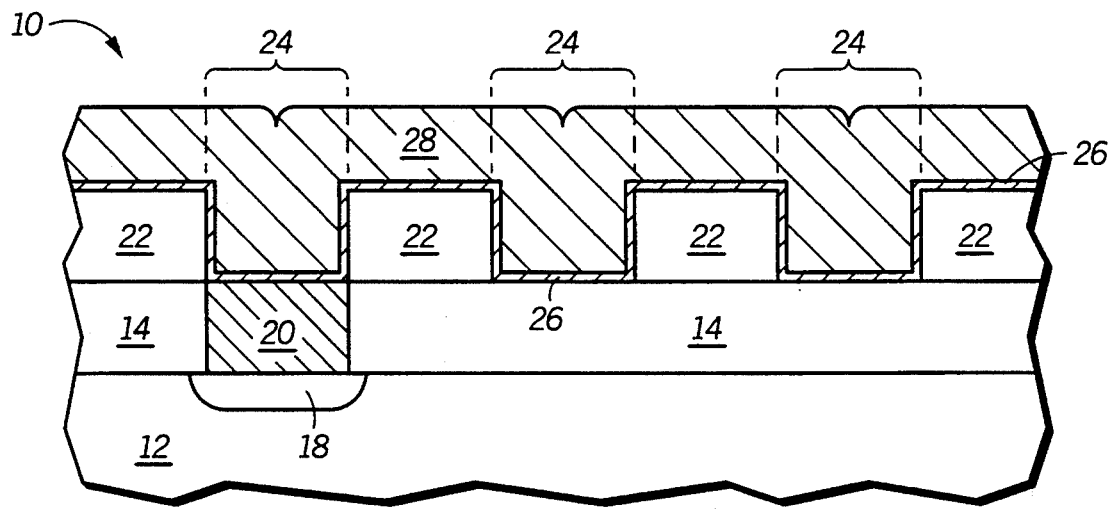

As illustrated in FIG. 3, after openings 24 have been formed within the dielectric layer, a conductive layer 26 is deposited over the semiconductor device. Conductive layer 26 is deposited in a conformal manner, such that sidewalls of dielectric layer 22 within opening 24 are coated, as is the top surface of conductive plug 20. For use in copper interconnect applications, conductive layer 26 may be a layer of tantalum, titanium-tungsten (TiW), titanium, or the like. Next, a copper layer 28 is blanketly deposited over semiconductor device 10. In depositing copper layer 28, each of the openings 24 is filled with copper. Within openings 24, the copper is separated from dielectric layer 22 by conductive layer 26. Conductive layer 26 serves both as an adhesion layer and as a diffusion barrier layer. Copper typically has poor adhesion to interlayer dielectric layers; therefore, conductive layer 26 is used to improve the adhesion of copper along the sidewalls and bottom portions of openings 24. If openings 24 also expose underlying conductive members, such as conductive plug 20, conductive layer 26 may also promote adhesion between the copper and the underlying conductive region. Being present along both sidewalls and along the bottom portions 24, conductive layer 26 also inhibits unwanted diffusion into and out of these regions. For adhesion purposes, layer 26 need not be conductive, although most interconnect applications will require electrical contact to underlying conductive members thereby making a conductive material for layer 26 most suitable.

Figure 4:
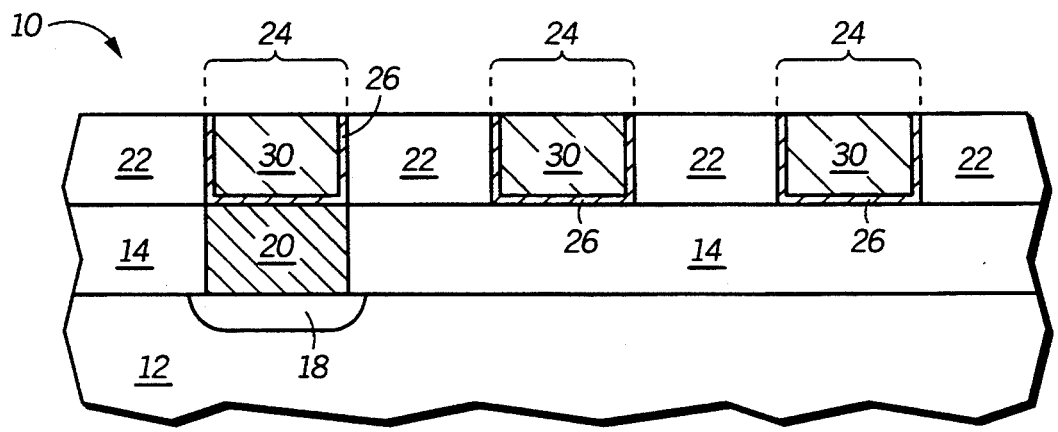
Figure 5:
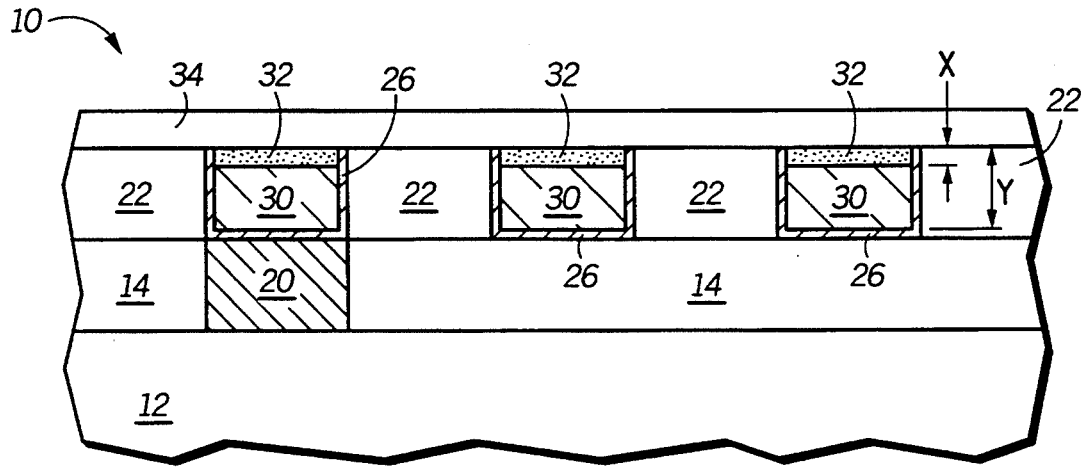

After copper layer 28 is deposited, the layer is polished back to form a plurality of copper interconnects 30 within openings 24, as illustrated in FIG. 4. Copper layer 28 may be polished back using conventional chemical, mechanical polishing (CMP) techniques. In polishing back copper layer 28, portions of conductive layer 26 overlying dielectric layer 22 are also removed. As a result, all that remains are conductive layer 26 and copper interconnects 30 formed within openings 24. As illustrated in FIG. 4, interconnects 30 are embedded within dielectric layer 22 and are surrounded on all but a top surface by conductive layer 26. Despite the fact that interconnects 30 are surrounded on side portions and bottom portions by a diffusion barrier in the form of conductive layer 26, the presence of the diffusion barrier does little good if the remaining top surface of the interconnect remains unprotected. As mentioned earlier, prior art processes for protecting the top surface of copper interconnect surfaces have been through the use of silicon nitride. As also mentioned, the use of such deposited silicon nitride capping layers creates reliability problems due to poor adhesion between the silicon nitride and the copper. In accordance with the present invention, the adhesion is much improved by the addition of an intervening copper silicide layer. This intervening copper silicide layer is illustrated in FIG. 5, and the formation of the silicide layer is described below.

In accordance with one embodiment of the present invention, silicon nitride is also used to cap exposed surfaces of copper members, but adhesion between the silicon nitride and these copper members is much improved over prior art processes. The improved adhesion is associated with the use of an intervening copper silicide layer. One method for forming a copper silicide layer in accordance with the present invention is described now in reference to FIGS. 1 and 5. Upon forming the desired copper structure, be it in the form of copper interconnects, copper plugs, or the like, the device is placed in a PECVD reaction chamber. As mentioned earlier, PECVD has been used to deposit silicon nitride films on copper surfaces in the past. However, in accordance with the present invention, the PECVD deposition process is enhanced by the addition of a copper silicide formation stage. Prior to actual deposition of silicon nitride and prior to generating a plasma within the reactor, silane is introduced into the reaction chamber. The silane reacts with any exposed surfaces of the copper to produce a copper silicide layer. Although a silane vapor is used to form copper silicide in a preferred embodiment of the present invention, one of ordinary skill in the art would understand that other silicon bearing gas species such as disilane, dichlorosilane, tetraethylorthosilicate may also be suitable for practicing the present invention. The duration of the silicidation process within the PECVD reaction chamber will vary depending on the desired thickness of the silicide layer. Moreover, the time to form the silicide will depend on a variety of processing parameters. A list of suitable processing parameters for use in practicing the present invention appears in Table 1 below. Because many of the processing variables listed will vary depending on reactor size and configuration, Table 1 includes a range of processing parameters which are likely to be suitable with many commercially available PECVD systems. As indicated in the silicidation column of Table 1, nitrogen ($N_2$) gas may also be introduced into the reaction chamber during the step of silicidation. The duration of the silicidation step, indicated in Table 1 as time, is listed as "Variable" since the time required to form a given thickness of silicide will vary depending upon the other parameters chosen. For example, a higher concentration of silane within the reaction chamber, a higher susceptor temperature, or a higher pressure, will hasten the silicidation process. Thus, for any given system, optimum parameters including time will have to be selected through experimentation, although the ranges listed in Table 1 should provide a useful guide.

TABLE 1

|  | Silicidation Stage | Transition Stage | Deposition Stage |
| --- | --- | --- | --- |
| SiH$_4$ (sccm) | 5 to 250 | — | 25 to 500 |
| NH$_3$ (sccm) | — | — | 5 to 400 |
| N$_2$ (sccm) | 5 to 1500 | — | 45 to 3000 |
| Power (watts) | — | — | 150 to 650 |
| Pressure (kPa) | 0.067–67 | Throttle open | 0.067–67 |
| Spacing (mm) | 5 to 20 | 385 | 5 to 20 |
| Temp. (°C.) | 200 to 450 | 375 | 200 to 450 |
| Time (sec.) | Variable | ≈3 | Variable |

Other aspects of the information presented in Table 1 which will help one understand the scope of the present invention, and to practice the invention, include the flowing. The gas flow ranges given are listed as standard cubic centimeters per minute (sccm). If a cell in the table contains ". . . " then that variable is off or not applicable to the particular stage of the process. For instance, the gas is not being introduced into the reaction chamber during the transition stage, nor is the plasma (indicated as the "Power" variable) generated during the silicidation stage or the transition stage. "Spacing" refers to the distance between susceptor or substrate holder and the plasma source. In some systems, the spacing is measured in mils, in which case the range would be 200–800 mils. Temperature refers to the susceptor temperature as measured by a thermocouple imbedded into the susceptor. The pressure within the chamber may be measured in torr in some systems. A range of 0.067 to 67 kilopascals (kPa) is roughly equal to a range of 0.5–500 torr. It should be noted that although ranges are not listed for variables in the transition stage, that values other than those precise values specified may also be used. Also, the fact that a range specified during the silicidation stage may be the same as that used in the deposition stage does not mean that the same value must be chosen for each stage. As an example, the temperature may be 250° C. in the silicidation stage, but 300° C. during deposition. Moreover, different gases may be used during the silicidation and deposition stages. Different chambers within a multi-chamber system may also be used for deposition and silicidation, wherein vacuum is not broken and an in-situ process is maintained.

Figure 6:
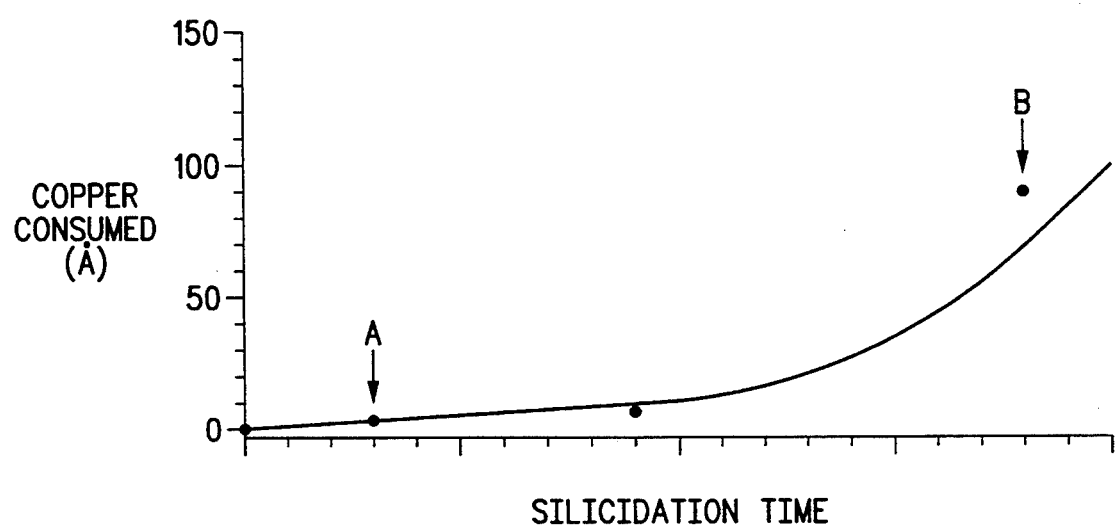
FIG. 6 is a representative graph comparing thickness of copper consumed with silicidation time, in accordance with a process of the present invention.

Rather than specifying time or other processing parameters, a more useful measurement for using a process in accordance with the present invention is the resulting silicide thickness. As a general rule, the thickness of a silicide layer should not exceed ten percent of the total thickness of the copper. For example, in reference to FIG. 5, a silicide layer 32 is formed on copper interconnects 30 in accordance with the previously described process. Preferably, the thickness of layer 32, indicated in FIG. 5 as 'X', should not be greater than ten percent of the total thickness of the copper interconnect, indicated in FIG. 5 as 'Y'. A reason for limiting the thickness of the silicide layer to less than ten percent of the total copper thickness is that silicidation degrades the resistivity of the copper interconnect. However, in other applications where resistivity is not as an important issue, silicidation thickness may not need to be as tightly controlled. Furthermore, some applications may find benefit from siliciding the entire thickness of a copper member. Although generally the silicide layer should not exceed ten percent of the total thickness of the copper interconnect, results have shown that a silicide layer thinner than 100 angstroms (100 Å) or less than two percent of the total copper thickness is sufficient to significantly improve the adhesion of a subsequently deposited PECVD silicon nitride film to the copper member. These results are indicated in FIG. 6, which is a graph illustrating the amount of copper consumed (in other words the silicide thickness) against the amount of time of the silicidation step. Point 'A' on the graph corresponds to a silicide layer less than ten angstroms (10 Å) thick. Experimentation indicates that such thickness is insufficient to significantly improve adhesion of a silicon nitride layer. However, point 'B' in FIG. 6 corresponds to a silicide thickness of approximately 80 angstroms (80 Å) and results in a significant improvement in adhesion.

After silicide layer 32 is formed on any exposed surfaces of the copper layer, the parameters of the CVD system are adjusted to initiate deposition of a silicon nitride layer. Prior to actually beginning the deposition process, a transition phase is included, as indicated in Table 1. The purpose of the transition period is to rid the reaction chamber of any gases which were introduced during the silicidation process. As Table 1 indicates, this can be accomplished by ceasing the flow of all gases into the chamber and opening a pressure throttle. The transition stage may be brief, for example, on the order of a few seconds. After the chamber is clean, silicon nitride deposition can begin. In accordance with one embodiment of the present invention, silicon nitride is deposited by introducing silane, ammonia (NH$_3$), and nitrogen, in the presence of a plasma. As mentioned earlier, the need for plasma enhanced deposition of silicon nitride is due to the need for a low temperature back end process. Table 1 indicates suitable processing parameters for depositing the silicon nitride layer in a typical PECVD system in accordance with the embodiment of the present invention. Again, time is left open as being "Variable" in Table 1 because the deposition time required to achieve a desired film thickness will roughly vary within the ranges indicated in Table 1 depending upon the design, shape and configuration of the reactor being used. The ranges provided in the deposition step of Table 1 are expected to be suitable for use with most conventional PECVD reactor systems. It should be noted that while Table 1 and the description above referred to the use of silane and ammonia gases in particular, that other gases may be used in forming a silicide layer or a capping layer in accordance with the present invention. For example, to form a silicide layer on exposed copper surfaces, a variety of silicon bearing gas species may be used. As an example, disilane, dichlorosilane, tetraethylorthosilicate. Likewise, in a deposition of a silicon nitride film, a variety of silicon bearing gas species in addition to a nitrogen bearing gas species may be combined to form a silicon nitride film. Suitable nitrogen bearing gas species other than ammonia may include nitrogen, hexamethyldisilazane, or other nitrogen bearing gas species used in semiconductor fabrication. While the silicon bearing gas species used to form the silicide layer and the silicon nitride layer need not be the same, in a preferred embodiment the same gas is used in both stages.

Although the time for a particular silicon nitride deposition may vary with reactor design and the particular processing parameters chosen, a typical thickness of a silicon nitride layer used to cap copper is on the order of 2000 Å. The thickness of the nitride layer should be such that the diffusion of copper and contaminates through the silicon nitride layer is inhibited. As FIG. 5 illustrates, a silicon nitride layer 34 will be deposited across the entire device surface using the deposition process described above. A blanket deposition of silicon nitride is a desirable result. Silicon nitride layers, in addition to serving a capping function, are often also used as an etch or polish stop layer. In such applications, a blanket layer of silicon nitride is preferred. In contrast to the silicon nitride deposition, formation of silicide layer 32 is a self-aligned process, as also illustrated in FIG. 5. Upon introducing silane into the reaction chamber, silicide will only form on exposed copper surfaces. The silane will not react with any exposed dielectric surfaces. (Note that in theory a copper silicide layer may be formed in the presence of a plasma using silane, but this would also have the undesirable consequence of depositing amorphous silicon on the dielectric surfaces in a non-self-aligned manner). It also be noted that any other exposed conductive members may also be silicided during the copper silicidation process. If desired silicidation of other members may be controlled by adjusting the silicidation parameters prescribed in Table 1. Copper readily reacts with silicon such that silicidation can occur even at room temperature. However, in other materials, silicidation may not be as easy. Thus, by lowering the temperature within the chamber, silicidation on other conductive members may be inhibited.

The foregoing description demonstrates many of the advantages of the present invention. A significant advantage of the present invention is the fact that a silicidation layer can be formed in-situ with a PECVD silicon nitride operation. In other words, both the silicidation and the silicon nitride deposition can occur within the same reactor chamber or with one system without breaking vacuum (i.e. without exposing the substrate to ambient). All that is required to perform the two separate steps is to change the flow of gases within the reactor chamber and to generate a plasma during the deposition process, but not during the silicidation process. Because formation of this silicide layer can be performed in-situ, a method in accordance with the present invention adds insignificant cost and time to the manufacturing process. Although a particular time for the silicidation process cannot be given, for the reasons indicated previously, in general, a silicidation process used in accordance with the present invention should not exceed 300 seconds. Another important advantage is that significantly improved adhesion results with only a thin layer of silicide formed on the copper surfaces. A thin layer is desirable because as the silicide layer thickness increases, necessarily the amount of copper consumed also increases. Copper silicide has a higher resistivity than copper; therefore, to achieve the lowest resistance possible in a copper member, the copper silicide layer should be kept to a minimal thickness. As noted above, however, there may be applications where resistivity is not as important as in interconnect applications. Another benefit of the present invention is that the desired properties of a bulk silicon nitride film formed as a capping layer are retained. The silicidation process prior to the silicon nitride deposition has no observed effect on the physical properties of the silicon nitride film, other than the fact that it is less likely to peel away from underlying copper members.

Thus, it is apparent that there has been provided in accordance with the invention, a method for capping copper in semiconductor devices, that fully meets the needs and advantages set forth previously. Although the invention has been described and illustrated with reference to specific embodiments thereof, it is not intended that the invention be limited to these illustrative embodiments. Those skilled in the art will recognize that modifications in variations can be made without departing from the spirit of the invention. For example, the present invention is not limited to copper applications involving the formation of interconnects. Rather, the invention can be used in conjunction with any use of copper within the fabrication of semiconductor devices. As one example, the present invention can be used in conjunction with the formation of copper plugs. Furthermore, the present invention is not limited to forming a capping layer only on a top surface of a copper member. The present invention can be used to form a diffusion barrier or capping layer on any exposed copper surface. Furthermore, the present invention is not limited to the formation of copper members using a CMP process. Any method for forming a copper member within a semiconductor device, including selective deposition and deposition with etch, is suitable for use in practicing the present invention. Nor is the present invention limited to use at any particular level within a semiconductor device. A semiconductor device includes multiple dielectric and conductive layers. The present invention can be used within any of these layers, and at any stage of the fabrication sequence. It should also be understood that the present invention is not limited to the specific process parameters provided in Table 1. Those parameters are merely illustrative of suitable parameters for use with typical, commercially available PECVD systems in practicing the present invention. Nor is the present invention limited strictly to PECVD systems, but rather may be used in conjunction with any low temperature deposition process compatible with copper metallurgy. It is also important to note the present invention does not require use of pure copper members. Copper alloys may also be silicided in accordance with the invention. Likewise, a silicon nitride layer used to cap a copper member may include other constituents, such as hydrogen or oxygen. Therefore, it is intended that this invention encompass all such variations and modifications as fall within the scope of the appended claims.

We claim:

1. A method for making a semiconductor device, comprising the steps of:
   forming a copper member within a semiconductor device, wherein the copper member has an exposed surface;
   forming a copper silicide layer on the exposed copper member surface; and
   depositing a layer comprising silicon nitride on the copper silicide layer.

2. The method of claim 1 wherein the step of depositing a silicon nitride layer comprises depositing a silicon nitride layer in-situ with the step of forming a copper silicide layer.

3. The method of claim 1 wherein the step of forming a copper silicide layer comprises reacting the exposed copper member surface with silane.

4. The method of claim 1 wherein the step of forming a copper silicide layer is performed in a substantially plasma-free environment, and the step of depositing a layer comprising silicon nitride is performed in a plasma environment.

5. The method of claim 1 wherein the copper member has an original thickness, and wherein the step of forming a copper silicide layer comprises reacting the exposed copper member surface such that less than ten percent of the original thickness of the copper member is consumed.

6. A method for making a semiconductor device, comprising the steps of:
 providing a semiconductor substrate;
 forming a dielectric layer overlying the substrate, the dielectric layer having an opening formed therein;
 depositing a copper layer over the dielectric layer such that copper substantially fills the opening;
 removing any portions of the copper layer beyond the opening, leaving a surface of the copper layer within the opening exposed; and
 capping the copper surface with a diffusion barrier material using a chemical vapor deposition process;
 wherein the step of capping comprises the steps of:
  forming a copper silicide layer by reacting a vapor species comprising silicon with the copper surface; and then
  forming a layer comprising silicon nitride on the copper silicide layer by reacting the vapor species comprising silicon with a vapor species comprising nitrogen.

7. The method of claim 6 wherein the step of forming a copper silicide layer comprises reacting the vapor species comprising silicon with the copper surface in absence of a plasma.

8. The method of claim 7 wherein the step of forming a layer comprising silicon nitride comprises reacting the vapor species comprising silicon with the vapor comprising nitrogen in presence of a plasma.

9. The method of claim 6 wherein the step of forming a copper silicide layer comprises forming a copper silicide layer by reacting silane with the copper surface.

10. The method of claim 9 wherein the step of forming a layer comprising silicon nitride comprises forming a layer comprising silicon nitride by reacting silane and ammonia.

11. The method of claim 6 wherein the copper within the opening has a thickness, after any copper beyond the opening is removed, and wherein the step of forming a copper silicide layer comprises forming a copper silicide layer such that less than ten percent of the copper thickness is consumed.

12. The method of claim 6 wherein the step of forming a copper silicide layer comprises forming a copper silicide layer having a thickness between approximately ten to one hundred angstroms.

13. The method of claim 6 wherein the step of forming a layer comprising silicon nitride is performed in-situ with the step of forming a copper silicide layer.

14. The method of claim 6 wherein the opening in the dielectric has sidewalls and a bottom, and further comprising the step of lining the sidewalls and bottom of the opening with a conductive diffusion barrier material, prior to depositing the copper layer.

15. The method of claim 14 wherein the step of lining comprises lining with a material selected from a group consisting of tantalum, titanium, and tungsten.

16. The method of claim 6 wherein the step of removing comprises removing by chemical mechanical polishing.

17. A method for making a semiconductor device comprising the sequential steps of:
 providing a semiconductor substrate having an overlying dielectric layer;
 forming a copper member overlying the substrate, the copper member having an exposed surface;
 placing the substrate in a chemical vapor deposition reaction chamber;
 introducing silane into the reaction chamber to form a copper silicide layer on the exposed copper surface;
 generating a plasma within the chamber; and
 introducing silane and ammonia into the reaction chamber in presence of the plasma to deposit a silicon nitride capping layer on the copper silicide layer.

18. The method of claim 17 wherein the step of forming a copper member comprises forming a copper interconnect.

19. The method of claim 17 wherein the step of forming a copper member comprises forming a copper member within an opening in the dielectric layer, and wherein the exposed copper surface is an upper surface of the copper member.

20. The method of claim 17 wherein the copper member has an original thickness, and wherein the step of introducing silane into the reaction chamber to form a copper silicide layer is terminated prior to consuming approximately ten percent of the original thickness of the copper member.

21. The method of claim 1 wherein the step of forming a copper member comprises forming a copper interconnect.

* * * * *